(12) United States Patent
Afzali-Ardakani et al.

(10) Patent No.: US 8,618,036 B2
(45) Date of Patent: Dec. 31, 2013

(54) AQUEOUS CERIUM-CONTAINING SOLUTION HAVING AN EXTENDED BATH LIFETIME FOR REMOVING MASK MATERIAL

(75) Inventors: Ali Afzali-Ardakani, Ossining, NY (US); John A. Fitzsimmons, Poughkeepsie, NY (US); Nicholas C. M. Fuller, North Hills, NY (US); Mahmoud Khojasteh, Poughkeepsie, NY (US); Jennifer V. Muncy, Ridgefield, CT (US); George G. Totir, Newtown, CT (US); Karl E. Boggs, Hopewell Junction, NY (US); Emanuel I. Cooper, Scarsdale, NY (US); Michael W. Owens, Ridgefield, CT (US); James L. Simpson, Austin, TX (US)

(73) Assignees: International Business Machines Corporation, Armonk, NY (US); Advanced Technology Materials, Inc., Danbury, CT (US)

( * ) Notice: Subject to any disclaimer, the term of this patent is extended or adjusted under 35 U.S.C. 154(b) by 50 days.

(21) Appl. No.: 13/295,677

(22) Filed: Nov. 14, 2011

(65) Prior Publication Data

US 2013/0123159 A1 May 16, 2013

(51) Int. Cl.
*H01L 21/302* (2006.01)
*H01L 21/311* (2006.01)

(52) U.S. Cl.
CPC ............................... *H01L 21/31133* (2013.01)
USPC ............................ 510/175; 510/176; 438/692

(58) Field of Classification Search
USPC ................................... 510/175, 176; 438/692
See application file for complete search history.

(56) References Cited

U.S. PATENT DOCUMENTS

| | | | |
|---|---|---|---|
| 4,362,807 A * | 12/1982 | Sato | 430/276.1 |
| 4,725,375 A | 2/1988 | Fujii et al. | |
| 2001/0013506 A1 | 8/2001 | Chamberlin et al. | |
| 2011/0140181 A1* | 6/2011 | Afzali-Ardakani et al. | 257/288 |
| 2011/0151653 A1* | 6/2011 | Afzali-Ardakani et al. | 438/530 |

FOREIGN PATENT DOCUMENTS

| | | |
|---|---|---|
| JP | 5779174 | 5/1982 |
| JP | 200268741 | 3/2002 |
| JP | 2010153781 | 7/2010 |
| WO | WO2012053497 | 4/2012 |

OTHER PUBLICATIONS

European Search Report dated May 13, 2013 received in a corresponding foreign application.
European Search Report dated Feb. 21, 2013 received in a corresponding foreign application.

* cited by examiner

*Primary Examiner* — Gregory Webb
(74) *Attorney, Agent, or Firm* — Scully, Scott, Murphy & Presser, P.C.; Louis J. Percello, Esq.

(57) ABSTRACT

An aqueous solution of a cerium (IV) complex or salt having an extended lifetime is provided. In one embodiment, the extended lifetime is achieved by adding at least one booster additive to an aqueous solution of the cerium (IV) complex or salt. In another embodiment, the extended lifetime is achieved by providing an aqueous solution of a cerium (IV) complex or salt and a cerium (III) complex or salt. The cerium (III) complex or salt can be added or it can be generated in-situ by introducing a reducing agent into the aqueous solution of the cerium (IV) complex or salt. The aqueous solution can be used to remove a mask material, especially an ion implanted and patterned photoresist, from a surface of a semiconductor substrate.

23 Claims, 1 Drawing Sheet

AQUEOUS CERIUM-CONTAINING SOLUTION HAVING AN EXTENDED BATH LIFETIME FOR REMOVING MASK MATERIAL

BACKGROUND

The present disclosure relates to semiconductor device manufacturing and, more particularly, to removing a mask material, especially an ion implanted and patterned photoresist, using an aqueous cerium-containing solution.

The fabrication of integrated circuits (ICs) on a semiconductor substrate typically includes the use of a front-end-of-the line (FEOL) process which forms one or more semiconductor devices such as, for example, transistors, on a surface of the semiconductor substrate. In a typical FEOL process, various selected areas of the semiconductor substrate are exposed to ion implantation of impurities (e.g., dopants) such as, for example, phosphorus, boron or arsenic, in order to create p-type and/or n-type regions. The doping of the selected areas of the semiconductor substrate begins with the deposition of a photoresist layer. The photoresist layer is typically dried and cured after deposition. The photoresist is photoactive, and can be modified by exposure to selected forms of radiant energy. Exposure of the photoresist is performed in a photolithography step where the semiconductor substrate is exposed to radiant energy of selected wavelengths through a mask. This mask defines those areas of the photoresist-coated substrate, which are subjected to the radiation and those that are not. Typically, the areas of photoresist that are subjected to the radiation are modified and can be removed by developing. This method of pattern transfer (from mask to substrate) leaves photoresist covering those areas of the semiconductor substrate that were shielded by the mask.

Ion implantation is then employed to drive the impurity dopants into those areas of the semiconductor substrate that are not protected by the photoresist. Subsequent to this step, all the photoresist must be removed before the semiconductor substrate is annealed, oxidized or processed in diffusion furnaces. Currently, post-implant photoresist removal is performed by wet etching, dry etching or a combination of wet etching and dry etching. Wet etching processes typically involve the employment of a mixture of sulfuric acid and hydrogen peroxide to remove the resist and other organic contaminants that might be present. The photoresist can also be removed using dry etching processes, typically involving the use of plasma oxidation. In a plasma process, a source of oxidant, such as oxygen, is introduced into a plasma field excited either by radio frequency or microwave frequency energy.

The recent process trends in the manufacture of IC's have caused an increase in the level of doping. This has been achieved by increasing the energy and density of the ion flux directed at the semiconductor substrate during the ion implantation process. As a consequence, the surface of the photoresist that shields certain areas of the semiconductor substrate from the ion implantation process is itself modified. Due to the high energy and flux density, surface layers of the photoresist undergo chemical and physical modification. The higher temperatures resulting from the ion bombardment cause further baking and hardening of the top surface layer of the photoresist. Also, the ion flux causes implantation of the resist with the dopant atoms. Moreover, the photoresist undergoes significant cross-linking and becomes more resistant to post-implant removal processes. The modified surface layer of the ion implanted photoresist is typically referred to in the art as a 'crusted surface layer'.

The conventional techniques of removing the ion implanted photoresist having the crusted surface layer also involve a combination of dry and wet etching, or a wet etch using sulfuric-acid-based chemistries, typically a mixture of sulfuric acid and hydrogen peroxide. A common drawback of all prior art strip methodologies includes the incomplete removal of the crusted surface layer of the ion implanted photoresist present on the semiconductor substrate surface post ion implantation.

Moreover, resist removal via conventional techniques has been shown to process excessive semiconductor material, e.g., Si, from the semiconductor substrate as well as dopant loss and possible damage to fragile semiconductor structures. Also, when metal gates are present on the surface of the semiconductor substrate during the ion implantation process, the prior art resist stripping methods mentioned above would damage the metal gate by oxidizing the same.

In view of the above, there is a continued need for providing an etchant solution that is capable of completely removing a mask material, particularly an ion implanted and patterned photoresist, from a surface of a semiconductor substrate.

SUMMARY

An aqueous solution of a cerium (IV) containing complex or salt (i.e., an aqueous cerium-containing solution) having an extended bath lifetime is provided. In one embodiment, the extended lifetime is achieved by adding at least one booster additive to an aqueous solution of the cerium (IV) complex or salt. In another embodiment, the extended lifetime is achieved by providing an aqueous solution of a cerium (IV) complex or salt and a cerium (III) complex or salt. The cerium (III) complex or salt can be added or it can be generated in-situ by introducing a reducing agent into the aqueous solution of the cerium (IV) complex or salt. The aqueous solution can be used to remove a mask material, especially an ion implanted and patterned photoresist, from a surface of a semiconductor substrate.

By "extended bath lifetime" it is meant that the aqueous cerium-containing solution of the present disclosure which contains either the at least one booster additive or the cerium (III) complex or salt is stable and does not show any significant decrease in performance over a longer period of time as compared to an equivalent aqueous cerium-containing solution that does not include either that at least one booster additive or a cerium (III) complex or salt. Moreover, the physical state of the aqueous cerium-containing solution of the present disclosure does not show any significant change in appearance for a longer period of time as compared to prior art aqueous cerium-containing solutions. For example, the aqueous cerium-containing solution of the present disclosure remains homogeneous and transparent, without the observance of any particles or phase separation for a longer period of time than prior art aqueous cerium-containing solutions.

In some embodiments, the aqueous cerium-containing solution of the present disclosure has a bath lifetime that is greater than 12 hours. In other embodiments, the aqueous cerium-containing solution of the present disclosure has a bath lifetime that is greater than 15 hours, or greater than 18 hours. Aqueous cerium-containing solutions disclosed in the prior art have a bath lifetime that is typically equal to or less than 8 hours. The bath lifetimes are for baths that have a temperature of 70° C.

In one aspect of the present disclosure, a method of removing a mask material is provided. The method includes providing an ion implanted and patterned mask material atop a substrate. Next, the ion implanted and patterned mask material is contacted with an aqueous solution comprising a cerium (IV) complex or salt.

In one embodiment, the aqueous solution comprising the cerium (IV) complex or salt includes at least one booster additive. That at least one booster additive of this embodiment of the present disclosure includes any monomeric and/or polymeric compound (organic and/or inorganic) that can be oxidized by Ce (IV). In some embodiments, the at least one booster additive is also miscible in water. Examples of booster additives that can be used in the present disclosure include, but are not limited to, monomeric and/or polymeric forms of an alcohol, a carboxylic acid, an aldehyde, a ketone, an ether, an ester, an amide, and mixtures thereof.

In another embodiment, the aqueous solution comprising the cerium (IV) complex or salt includes a cerium (III) complex or salt. In such an embodiment, the cerium (III) complex or salt can be added or it can be generated in-situ by introducing a reducing agent into the aqueous solution of the cerium (IV) complex or salt. The contacting of the ion implanted and patterned mask material with the aqueous solution described above removes the ion implanted and patterned mask material from atop the semiconductor substrate.

In another aspect of the present disclosure, an aqueous solution that is capable of removing a mask material is provided. In one embodiment, the aqueous solution includes a cerium (IV) complex or salt and at least one booster additive. That at least one booster additive of this embodiment of the present disclosure includes any monomeric and/or polymeric compound (organic and/or inorganic) that can be oxidized by Ce (IV). In some embodiments, the at least one booster additive is also miscible in water. Examples of booster additives that can be used in the present disclosure include, but are not limited to, monomeric and/or polymeric forms of an alcohol, a carboxylic acid, an aldehyde, a ketone, an ether, an ester, an amide, and mixtures thereof.

In another embodiment, the aqueous solution includes a cerium (IV) complex or salt and a cerium (III) complex or salt. In such an embodiment, the cerium (III) complex or salt can be added or it can be generated in-situ by introducing a reducing agent into the aqueous solution of the cerium (IV) salt. The reducing agent that can be employed includes $H_2O_2$ or any other peroxide or peroxide daughters (i.e., secondary components of peroxide) that can act as a reducing agent in the presence of Ce (IV). In some embodiments, the reducing agent can include Ce and other lanthanide metals in an oxidation state lower than (III), e.g. metallic Ce, and/or $EuCO_3$.

DETAILED DESCRIPTION

The present disclosure which provides an aqueous cerium-containing solution that has an extended bath lifetime and the use thereof for removing a mask material, particularly an ion implanted and patterned photoresist, from a surface of a semiconductor substrate, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
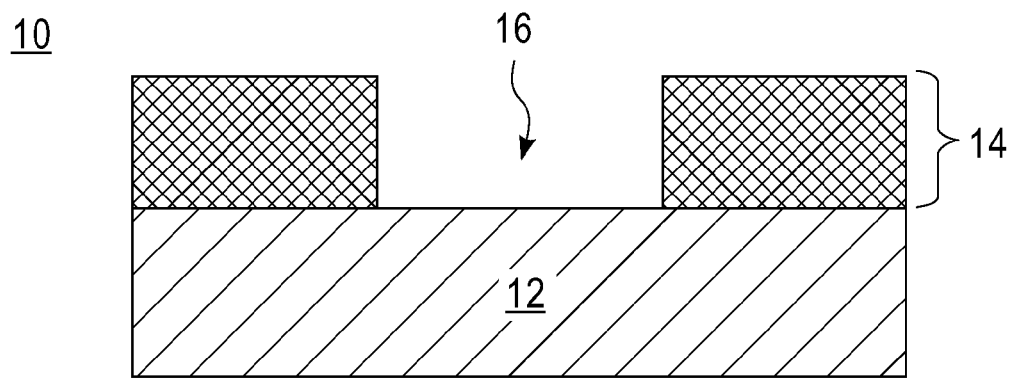
FIG. 1 is a pictorial representation (through a cross sectional view) illustrating an initial structure including a patterned photoresist having at least one opening therein that exposes an upper surface of a semiconductor substrate that can be employed in one embodiment of the present disclosure.
Figure 2:
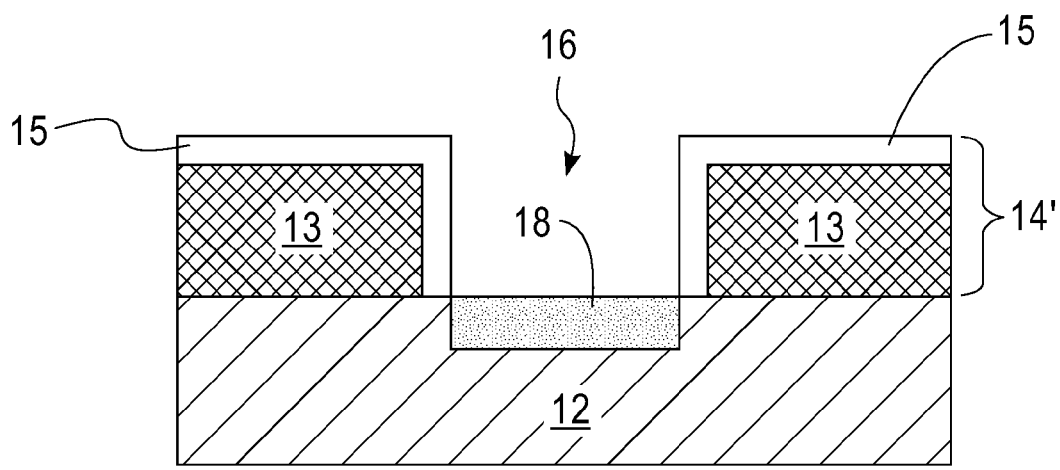
FIG. 2 is a pictorial representation (through a cross sectional view) illustrating the structure of FIG. 1 after ion implantation in which dopants are introduced into the exposed upper surface of the semiconductor substrate and the patterned photoresist.
Figure 3:
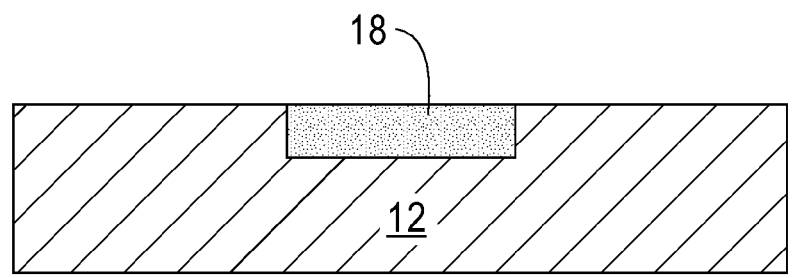
FIG. 3 is a pictorial representation (through a cross sectional view) illustrating the structure of FIG. 2 after resist stripping using an aqueous cerium-containing solution in accordance with the present disclosure.

Reference is now made to FIGS. 1-3 which depict various stages of semiconductor fabrication before and after ion implantation and stripping operations in accordance with an embodiment of the present disclosure. FIG. 1 illustrates an initial structure 10 that can be employed in one embodiment of the invention. The initial structure 10 includes at least a patterned photoresist 14 having at least one opening 16 therein that is located atop a semiconductor substrate 12. As shown, the at least one opening 16 of the patterned photoresist 14 exposes a portion of the semiconductor substrate 12 in an area in which one or more dopants are to be subsequently introduced via ion implantation.

The semiconductor substrate 12 can be a bare semiconductor material or a semiconductor material that is processed to include various isolation regions and/or semiconductor devices, such as metal gates, on the surface of the semiconductor substrate 12. The isolation regions and/or semiconductor devices can be formed utilizing FEOL processing techniques that are well known to those skilled in the art. In some embodiments, the isolation regions and/or semiconductor devices are located adjacent to the at least one opening 16 such that the at least one opening 16 exposes a bare surface of the semiconductor substrate 12.

The semiconductor substrate 12 includes any semiconductor material including, but not limited to Si, SiGe, SiGeC, SiC, Ge alloys, GaAs, InAs, InP and other III/V or II/VI compound semiconductors. In addition to these listed types of semiconductor materials, the semiconductor substrate 12 can also be a layered semiconductor such as, for example, Si/SiGe, Si/SiC, silicon-on-insulators (SOIs) or silicon germanium-on-insulators (SGOIs). In some embodiments, the semiconductor substrate 12 is a Si-containing semiconductor material, i.e., a semiconductor material that includes silicon. The semiconductor substrate 12 may include a single crystal orientation or it may include at least two coplanar surface regions that have different crystal orientations (the latter substrate is referred to in the art as a hybrid substrate).

In one embodiment (not shown), a metal gate stack including at least a gate dielectric and a metal gate can be formed on the surface of the semiconductor substrate 12. The gate dielectric is located between the semiconductor substrate 12 and the overlying metal gate. When such an embodiment is employed, the patterned photoresist 14 typically protects the metal gate stack, while leaving a portion of the semiconductor substrate 12 through the at least one opening 16 and at the footprint of the metal gate stack exposed. In such an embodiment, the gate dielectric includes any gate insulating material including for example, semiconductor or metal oxides, nitrides and/or oxynitrides. For example, the gate dielectric may include silicon oxide, silicon nitride, silicon oxynitride, aluminum oxide, titanium oxide, hafnium oxide, zirconium oxide and multilayered stacks thereof. The metal gate of the metal gate stack includes any conductive metal, metal nitride and/or metal silicide. In one embodiment of the present disclosure, the metal gate is comprised of TiN. In some embodiments, a Si-containing gate electrode material can be used with the metal gate electrode material or in place thereof.

The patterned photoresist 14 including the at least one opening 16 is formed by first applying a blanket layer of photoresist material (i.e., masking material) to the surface of the semiconductor substrate 12. The photoresist material may include any conventional photoresist material including a positive-tone photoresist material or a negative-tone photoresist material. By "positive-tone" it is meant that the part of the photoresist that is exposed to photolithography will be removed by a conventional developer, while the unexposed part of the photoresist is not removed. By "negative-tone" it is meant that the part of the photoresist that is exposed to photolithography will not be removed by a conventional developer, while the unexposed part of the photoresist is removed. The photoresists may include photoacid generators, base additives and/or solvents, each of which is well known to those skilled in the art and, as such, details regarding those components are not fully provided.

The blanket layer of photoresist material is formed on the surface of the semiconductor substrate 12 utilizing techniques well known to those skilled in the art including, for example, spin-on coating, dip coating, evaporation, chemical solution deposition, and chemical vapor deposition. After application of the blanket layer of photoresist material, the blanket layer of photoresist material is typically dried and cured utilizing processing conditions that are well known to those skilled in the art. The photoresist material is then subjected to photolithography which includes exposing the blanket layer of photoresist material to a desired pattern of radiation and then removing portions of the exposed photoresist material utilizing a conventional developer so as to form the initial structure 10 such as shown, for example, in FIG. 1.

Referring to FIG. 2, there is illustrated the structure of FIG. 1 after introducing at least one dopant into the exposed portions of the semiconductor substrate 12 utilizing the patterned photoresist 14 as an ion implantation mask. As is shown in FIG. 2, a dopant region 18 is formed into the exposed portion of the semiconductor substrate 12. The ion energy or intensity of the ion bombardment determines the depth or thickness of the dopant region 18. The density of the ion flux determines the extent of the doping. In some embodiments, the dopant region 18 can be a well region located within the semiconductor substrate 12. In other embodiments, the dopant region 18 can be a source/drain region of a field effect transistor which would be formed at the footprint of a metal gate stack or a non-metal gate stack as described above. When a gate stack is present, an edge portion of the dopant region 18 can be self-aligned to an outer vertical sidewall of the gate stack. In some embodiments, at least one edge portion of the dopant region 18 can contact a sidewall edge of an isolation region that present in the semiconductor substrate 12.

In addition, dopants are also introduced into the patterned photoresist forming an ion implanted and patterned photoresist 14' which includes a crusted surface layer 15. As is shown in FIG. 2 the crusted surface layer 15 is located within an uppermost horizontal surface of the ion implanted and patterned photoresist 14' as well as within vertical sidewalls of the ion implanted and patterned photoresist 14'. The crusted surface layer 15 may be comprised of carbonized and highly crosslinked polymer chains. The crusted surface layer 15 is typically depleted of hydrogen and impregnated with the implant species. The crusted surface layer 15 is denser than the remaining portion 13, e.g., bulk portion, of the ion implanted and patterned photoresist 14'. The relative density of the crusted surface layer 15 depends on the ion flux, while the thickness of the crusted surface layer 15 depends on the ion energy.

The implantation of dopants described above can be performed by plasma immersion ion implantation or by ion beam ion implantation. The types of dopants that are implanted may vary and include species from Group VA of the Periodic Table of Elements, i.e., one of P, As, and Sb, or species from Group IIIA of the Periodic Table of Elements, i.e., one of B, Al, Ga, and In. In one embodiment of the present disclosure, the dopants include at least one of B, P and As. The dosage of dopants being implanted may vary, but typically the dosage of the dopants being implanted is greater than 1E15 atoms/cm$^2$. More typically, the dosage of the dopants being implanted is between 1E15 and 1E16 atoms/cm$^2$. The energy of the implant may also vary, with an energy from 1 keV up to 50 keV being typically employed in one embodiment of the present disclosure. Other dosages and/or energies that are greater than or lesser than the ranges mentioned above can also be employed in the present disclosure.

In some embodiments and during the ion implantation, small amounts of a material (not shown) may be sputtered to the patterned photoresist sidewalls. This sputtered material may include some of the implant species, other material in the plasma or ion beam, and by-products of the implantation. The actual species present within the sputtered material depends on the composition of the substrate 12 before ion implantation, the photoresist and the implanted species.

The crusted surface layer 15 of the ion implanted and patterned photoresist 14' is more difficult to strip than the remaining portion 13 of the ion implanted and patterned photoresist 14'. Removal rates of the crusted surface layer 15 may be 50% or 75% slower than the remaining portion 13 of the ion implanted and patterned photoresist 14'. Moreover, at elevated temperatures (of about 150° C.), the remaining portion 13 of the ion implanted and patterned photoresist 14' may outgas and expand relative to the crusted surface layer 15. The entire ion implanted and patterned photoresist 14' can thus 'pop' as the remaining portion 13 of the ion implanted and patterned photoresist 14' builds up pressure under the crusted surface layer 15. As is known to those skilled in the art, photoresist popping is a source of particles and process defects because the residues are especially hard to clean from the surface of the semiconductor substrate 12 as well as the surfaces of the tools used to process the structure.

Referring to FIG. 3, there is illustrated the structure of FIG. 2 after stripping, i.e., removing, the ion implanted and patterned photoresist 14' including the crusted surface layer 15 from atop the semiconductor substrate 12. The stripping of the ion implanted and patterned photoresist 14' including the crusted surface layer 15 from the semiconductor substrate 12 includes contacting the structure shown in FIG. 2 with an aqueous solution of the present disclosure.

The aqueous solution of the present disclosure includes the Lanthanoid element cerium; as such the aqueous solution can also be referred to herein as an aqueous cerium-containing solution. While cerium is the active element employed in the aqueous solution, it is to be understood that elements with the same or similar chemical characteristics as cerium could be used. For example, other Lanthanoid elements may have some characteristics similar to cerium and thus could be used. Lanthanoid elements are generally known to be those elements with atomic numbers 57 through 71, i.e., lanthanum, cerium, praseodymium, neodymium, promethium, samarium, europium, gadolinium, terbium, dysprosium, holmium, erbium, thulium, ytterbium, and lutetium. In some embodiments, praseodymium and/or terbium can be used.

The aqueous solution of the present disclosure comprises at least one cerium (IV) complex or salt. In one embodiment, the at least one cerium (IV) complex or salt can be, for example, cerium ammonium nitrate. The chemical formula of cerium ammonium nitrate may be expressed as $Ce(NH_4)_2(NO_3)_6$ or $(NH_4)_2Ce(NO_3)_6$. Cerium ammonium nitrate is also known as CAN, cerium (IV) ammonium nitrate, ceric ammonium nitrate and ammonium cerium nitrate. CAN is an orange, water-soluble salt that may be used as an oxidizing agent.

Other cerium (IV) complexes or salts that may be used include, but are not limited to, ceric nitrate, ceric ammonium sulfate, ceric sulfate, ceric bisulfate, ceric perchlorate, ceric methanesulfonate, ceric trifluoromethanesulfonate, ceric chloride, ceric hydroxide, and ceric acetate. These cerium (IV) complexes or salts can be used in place of or in conjunction with CAN. In some embodiments of the present disclosure, the solution may comprise more than one of the above cerium (IV) complexes or salts. In some embodiments, the cerium (IV) complex or salt preferably comprises cerium ammonium nitrate.

Since ceric solutions in water tend to hydrolyze and generate precipitates over time, especially when kept above ambient temperature (i.e., above about 20° C. to 25° C.), at least one stabilizer may be employed in order to stabilize the solution. Stated in other terms, ceric (IV) complexes or salts in water are generally stable, but at elevated temperatures around 70° C., ceric (IV) complexes or salts generate precipitate due to hydrolysis and/or redox reactions. However, in strongly acidic solutions such precipitates are soluble. By "strongly acid" it is meant a pH of less than about 0.5. For this reason, the cerium-containing solution is typically formulated in an acidic media in order to stabilize the solution and prevent or limit precipitation of the cerium. The acidic media, which can be provided for by at least one stabilizer, acts to reduce precipitation, for example, by dissolving precipitant from the solution. The at least one stabilizer may be referred to as a bath stabilizer. However, the stabilizing effect of acids should be balanced against the fact that high concentrations of added acids typically make the solution more aggressive toward metal gates, if present.

In one embodiment, the at least one stabilizer is an ammonium salt. The ammonium salt is in addition to the ammonium compound in CAN or any other ammonium compound of cerium that can be employed as the cerium (IV) salt. Ammonium salts that can be used as a stabilizer include, but are not limited to, at least one of ammonium chloride, ammonium nitrate, ammonium sulfate $(NH_4)_2SO_4$, ammonium bisulfate, ammonium acetate, ammonium perchlorate $(NH_4ClO_4)$, ammonium trifluoroacetate, ammonium methanesulfonate, and ammonium trifluoromethane sulfonate.

Other compounds that are stabilizers and which can be employed in the aqueous solution of the present disclosure include, but are not limited to, acids. Acids that can be employed as a stabilizer agent include, but are not limited to, one or more of nitric acid, hydrochloric acid, sulfuric acid, perchloric acid, glacial acetic acid, methanesulfonic acid, trifluoromethanesulfonic acid, and polysulfonic acid (e.g., poly(4-styrenesulfonic acid). Alternatively, or in addition to, other water soluble acidic polymers may be added including, but not limited to, polyacrylic acid, polymethacrylic acid, and other polymeric acids. Examples of polymeric acids include, but are not limited to, polymaleic acid, polytetrafluorosulfonic acid, poly(ethylene-maleic) acid and polystyrene carboxylic acid.

In one embodiment, the effective range of concentrations for the stabilizer that can be present in the aqueous cerium-containing solution is from 0.5% to 15% by weight, based on the total weight of the aqueous cerium-containing solution. In another embodiment, the effective range of concentrations for the stabilizer that can be present in the aqueous cerium-containing solution is from 0.5% to 10% by weight, based on the total weight of the aqueous cerium-containing solution.

In addition to the above, the aqueous cerium-containing solution includes water such as deionized water (DI water) as a solvent. In one embodiment, the aqueous cerium-containing solution includes from 1 wt % to 50 wt % cerium (IV) complex or salt and from 50 wt % to 99 wt % water, based on the total weight of the aqueous solution. In another embodiment, aqueous cerium-containing solution includes from 10 wt % to 40 wt % cerium (IV) complex or salt and from 60 wt % to 90 wt % water, based on the total weight of the aqueous solution. In yet another embodiment, the aqueous cerium-containing solution includes from 15 wt % to 35 wt % cerium (IV) complex or salt and from 65 wt % to 85 wt % water, based on the total weight of the aqueous cerium-containing solution. In an even further embodiment, the aqueous cerium-containing solution includes from 20 wt % to 30 wt % cerium (IV) complex or salt and from 70 wt % to 80 wt % water, based on the total weight of the aqueous cerium-containing solution.

It is noted that aqueous cerium-containing solutions comprising a cerium (IV) complex or salt alone has a bath lifetime that is typically less than 1 hour at 70° C. For aqueous cerium-containing solutions including one of the above mentioned stabilizers, i.e., ammonium compound and/or acid, the bath lifetime can be increased to less than or equal to 8 hours at 70° C. Further improvement in the bath lifetime is however needed.

In one embodiment of the present disclosure, an extended bath lifetime can be achieved by adding at least one bath lifetime booster additive (herein after just booster additive) to one of the above mentioned aqueous cerium-containing solutions. The at least one booster additive, which is employed with the cerium (IV) complex or salt, and optionally, the at least one stabilizer, extends the lifetime of the aqueous solution beyond that which can be obtained in the absence of the at least one booster additive. The at least one booster additive employed in this embodiment of the present disclosure, may be referred to as a co-additive.

That at least one booster additive that can be used in the present disclosure includes any monomeric and/or polymeric compound (organic and/or inorganic) that can be oxidized by Ce (IV). In some embodiments, the booster additive is also miscible in water. Examples of booster additives that can be used in the present disclosure include, but are not limited to, monomeric and/or polymeric forms of an alcohol, a carboxylic acid, an aldehyde, a ketone, an ether, an ester, an amide, and mixtures thereof.

The term "alcohol" as used herein denotes an organic compound in which at least one hydroxyl functional group (—OH) is bound to a carbon atom, usually connected to other carbon or hydrogen atoms. In one embodiment, the alcohol that can be employed as the at least one booster additive is a mono-alcohol, i.e., a compound having one hydroxyl functional group. In another embodiment, the alcohol that can be employed as the at least one booster additive is a poly-alcohol, i.e., a compound having two or more hydroxyl functional groups. The alcohol which can be straight chains, branched or cyclic typically has from 1 to 5 carbon atoms. More typically, the alcohol has from 1 to 4 carbon atoms.

Examples of alcohols that can be employed in the present disclosure as a booster additive include, but are not limited to, methanol, ethanol, propanol, isopropanol, n-butanol, isobutanol, t-butanol, ethylene glycol, glycerol, cyclopropanol, cyclobutanol, cyclopentanol, polyvinylalcohol (PVA), and polyethylene glycol (PEG). Polymers with at least one alcohol functionality as an end group can also be employed as a booster additive. In one embodiment, the alcohol that is employed as the booster additive is n-butanol. In another embodiment, the alcohol that is employed as the booster additive is isopropanol. In one embodiment, the alcohol that is employed as the booster additive is polyethylene glycol (PEG).

The term "carboxylic acid" as used herein denotes an organic acid which is characterized by the presence of at least one carboxyl group (i.e., —COOH). In some embodiments, the carboxylic acid may include a single carboxyl group. In other embodiments, the carboxylic acid may contain two or more carboxyl groups. Examples of carboxylic acids that can be employed in the present disclosure as a booster additive include, but are not limited to, formic acid, acetic acid, propionic acid, butyric acid, isobutyric acid, and oxalic acid.

The term "aldehyde" as used herein denotes an organic compound containing a formyl group, i.e., —CHO. Examples of aldehydes that can be employed in the present disclosure as a booster additive include, but are not limited to, formaldehyde, acetaldehyde, and glyoxal.

The term "ketone" as used herein denotes an organic compound containing the structure RC(=O)R', where R and R' can be a variety of atoms and groups of atoms. Typically, R and R' are the same or different and are selected from hydrocarbon groups (saturated or unsaturated and straight chain or branched) containing from 1 to 5 carbon atoms. Examples of ketones that can be employed in the present disclosure as a booster additive include, but are not limited to, acetone, and methyl ethyl ketone.

The "term" ester" as used herein denotes a chemical compound derived by reacting an oxacid with a hydroxyl compound such as an alcohol or phenol. Esters are usually derived from an inorganic acid or organic acid in which at least one —OH (hydroxyl) group is replaced by an —O-alkyl (alkoxy) group, and most commonly from carboxylic acids and alcohols. Typically, an ester includes a compound having the formula $R^1(CO)OR^2$ in which $R^1$ and $R^2$ are the same or different and are typically selected from hydrocarbon groups (saturated or unsaturated and straight chain or branched) containing from 1 to 5 carbon atoms. Examples of esters that can be employed in the present disclosure as a booster additive include, but are not limited to, methyl acetate and ethyl acetate.

The term "amide" as used herein denotes an organic compound that contains the functional group consisting of a carbonyl group ($R^3$—C=O) linked to a nitrogen atom (N). $R^3$ is typically selected from hydrocarbon groups (saturated or unsaturated and straight chain or branched) containing from 1 to 5 carbon atoms. Examples of amides that can be employed in the present disclosure as a booster additive include, but are not limited to, acetamide.

The term "ether" as used herein denotes an organic compound having the general formula $R^4$—O—$R^5$ wherein $R^4$ and $R^5$ are the same or different and are typically selected from hydrocarbon groups (saturated or unsaturated and straight chain or branched) containing from 1 to 5 carbon atoms. Examples of ethers that can be employed in the present disclosure as a booster additive include, but are not limited to, diethyl ethyl, methyl t-butyl ether, and di-t-butyl ether.

The booster additive can also include two or more of the functional groups mentioned above. Examples include, but are not limited to, glycolic acid (alcohol+acid), glyoxylic acid (alcohol+aldehyde), methyl carbitol (alcohol+ether), alpha-hydroxyisobutyric acid (alcohol+acid), and pyruvic acid (alcohol+ketone).

Notwithstanding the type of booster additive employed, the at least one additive is typically present in the aqueous cerium-containing solution in an amount from 25 ppm to 2500 ppm. More typically, the at least one additive is present in the aqueous cerium-containing solution in an amount from 50 ppm to 500 ppm.

In one embodiment, the at least one booster additive can be added to a premixed aqueous cerium-containing solution utilizing any method well known to those skilled in the art. In another embodiment, at least one booster additive is added during the preparation of a fresh sample of the aqueous cerium-containing solution.

In another embodiment of the present disclosure, an extended bath lifetime can be achieved by providing a cerium (III) complex or salt to one of the above mentioned aqueous cerium-containing solutions. In some embodiments, at least one booster additive and a cerium (III) complex or salt can be employed together within an aqueous cerium-containing solution to extend the bath lifetime of the same.

The cerium (III) complex or salt which is employed with the cerium (IV) complex or salt, and optionally, the at least one stabilizer, extends the lifetime of the aqueous solution beyond that which can be obtained in the absence of the cerium (III) complex or salt.

In one embodiment, the cerium (III) complex or salt may be added to a premixed aqueous cerium-containing solution. In another embodiment, the cerium (III) complex or salt may be added during the preparation of a fresh sample of the aqueous cerium-containing solution. In either embodiment, the cerium (III) complex or salt is typically present in the aqueous cerium-containing solution in an amount from 250 ppm to 25,000 ppm. More typically, the cerium (III) complex or salt is present in the aqueous cerium-containing solution in an amount from 500 ppm to 15,000 ppm.

Examples of cerium (III) complexes or salts that can be employed in this embodiment of the present disclosure include, but are not limited to, cerium(III) nitrate, cerium(III) ammonium nitrate, cerium(III)acetate, cerium(iii) carbonate, cerium(III) oxatate, cerium(III) trifluoroacetylacetonate, and cerium(III) sulfate.

In another embodiment, the cerium (III) complex or salt can be generated in-situ by adding or including a reducing agent within the cerium-containing aqueous solution. The term "reducing agent" as used herein denotes an element or compound in a reduction-oxidation reaction that donates an electron to cerium (IV) and thus reduces it to cerium (III). In the present disclosure, any compound with an oxidation potential less than Ce (IV) can be used to reduce Ce(IV) to Ce(III). Examples of reducing agents that can be employed in the present disclosure include, but are not limited to, peroxides (or peroxide daughters) such as, for example, $H_2O_2$. Other examples include Ce and other lanthanide metals having an oxidation state lower than (III), e.g. metallic Ce, and/or $EuCO_3$.

Notwithstanding the type of reducing agents employed, the reducing agent is typically present in the aqueous cerium-containing solution in an amount from 50 ppm to 500 ppm. More typically, the reducing agent is present in the aqueous cerium-containing solution in an amount from 100 ppm to 250 ppm.

In some embodiments, the aqueous cerium-containing solution of the present disclosure, i.e., containing the at least one booster additive and/or cerium (III) complex or salt, has a bath lifetime that is greater than 8 hours at 70° C. In other embodiments, the aqueous cerium-containing solution of the present disclosure, i.e., containing the at least one booster additive and/or cerium (III) complex or salt, has a bath lifetime that is greater than 10 hours, or greater than 12 hours at 70° C. Aqueous cerium-containing solutions disclosed in the prior art have a bath lifetime that is typically equal to or less than 8 hours at 70° C.

In some embodiments of present disclosure, an improvement in bath lifetime of about 6 times or greater is achieved using the aqueous cerium-containing solution of the present disclosure, i.e., containing the at least one booster additive and/or cerium (III) complex or salt. In other embodiments of present disclosure, an improvement in bath lifetime of about 4 times greater is achieved using the aqueous cerium-containing solution of the present disclosure, i.e., containing the at least one booster additive and/or cerium (III) complex or salt.

Embodiments of the cerium-containing aqueous solution of the present disclosure include, but are not limited to, (i) a solution comprising, consisting of, or consisting essentially of, cerium (IV) complex or salt, a solvent (i.e., water) and at least one booster additive and/or cerium (III) complex or salt, (ii) a solution comprising, consisting of, or consisting essentially of, cerium (IV) complex or salt, solvent (i.e., water), ammonium salt, and at least one booster additive and/or cerium (III) complex or salt, (iii) a solution comprising, consisting of, or consisting essentially of, cerium (IV) complex or salt, solvent (i.e., water), acid and at least one booster additive and/or cerium (III) complex or salt, or (iv) a solution comprising, consisting of, or consisting essentially of, cerium (IV) complex or salt, solvent (i.e., water), ammonium salt, acid and at least one booster additive and/or cerium (III) complex or salt.

The contacting of the structure shown in FIG. 2 with the above described aqueous cerium-containing solution may include immersion of the structure in the aqueous solution. Other methods of contact are also contemplated, for example, spraying, rinsing or washing the structure shown, for example, in FIG. 2 with the aqueous solution, and agitating the structure in the aqueous solution. The structure is typically contacted with the aqueous cerium-containing solution of the present disclosure for a specific time duration. Time durations between 5 minutes and 60 minutes are examples of effective time durations for the contacting the structure with the aqueous cerium-containing solution of the present disclosure. Other time durations that are greater than or lesser than the range mentioned above can also be employed.

The aqueous cerium-containing solution and/or the structure shown in FIG. 2 may be heated to and/or maintained at a specific temperature or within a specific temperature range. Temperatures low enough to prevent popping of the ion implanted and patterned resist 14' are preferred. Other considerations may also dictate an upper limit on the temperature range, for example, the boiling point of water. Temperatures between 35° C. and 90° C. are examples of effective temperatures for using the aqueous cerium-containing solution of the present disclosure to remove the ion implanted and patterned resist 14' including the crusted surface layer 15 from the surface of the semiconductor substrate 12.

Contact of the semiconductor substrate 12 and the ion implanted and patterned resist 14' illustrated in FIG. 2 to the aqueous cerium-containing solution of the present disclosure may change one or more characteristics of the masking material. For example, contact of the semiconductor substrate 12 and the ion implanted and patterned resist 14' illustrated in FIG. 2 to the aqueous cerium-containing solution of the present disclosure may make the masking material, especially the crusted surface layer 15 of the masking material, soluble, or more soluble than before contact with the aqueous cerium-containing solution of the present disclosure.

The above processing steps can result in complete removal of the ion implanted and patterned photoresist 14" including the crusted surface layer 15 from the structure. In some embodiments, complete removal of the ion implanted and patterned photoresist 14" including the crusted surface layer 15 can be achieved using a single contact step. In other embodiments, complete removal of the ion implanted and patterned photoresist 14" including the crusted surface layer 15 can be achieved using a plurality of contact steps. The structure that is formed after the performing the above contact with the aqueous cerium-containing solution of the present disclosure is illustrated, for example, in FIG. 3.

In the present disclosure, the removal of the ion implanted and patterned photoresist 14' and crusted surface layer 15 occurs without any significant loss of the semiconductor substrate 12 or dopant within dopant region 18.

Moreover, and in embodiments, in which metal gates are present, the above technique does not result in any damage to the metal gates. This is evidence by measuring the thickness of the metal gate before and after removal of the ion implanted and patterned photoresist. When using the above processing technique, little or no loss of the metal gate is observed since the thickness of the metal gate before and after the above processing is substantially the same.

In some embodiments of the present disclosure, the structure shown in FIG. 3 may be subjected to a cleaning step after stripping the ion implanted and patterned photoresist 14' and crusted surface layer from the structure. When a cleaning step is employed, an acid such as, for example, sulfuric acid, nitric acid, phosphoric acid, methanesulfonic acid, trifluoromethanesulfonic acid, acetic acid, and trifluoroacetic acid, may be used. The optional cleaning step may be performed at room temperature or at an elevated temperature within the ranges mentioned above for the photoresist stripping step. The duration of this contact may vary. Typically, the duration of this contact is from 5 minutes to 30 minutes, with a duration of this contact from 10 minutes to 20 minutes being more typical. In one embodiment, the cleaning step is performed utilizing $H_2SO_4$. In such an embodiment, the $H_2SO_4$ contact typically occurs at 40° C.-60° C. for a duration from 10 minutes to 30 minutes.

The following examples are provided to illustrate some aspects of the present disclosure and to show some advantages that can be obtained using an aqueous cerium-containing solution of the present disclosure.

EXAMPLE 1

In this example, three cerium-containing aqueous solutions were prepared and their bath lifetimes were determined. Solution A (Comparative) was prepared by first dissolving 12.50 grams of cerium ammonium nitrate (CAN) in 37.50 grams of deionized (DI) water. Solution B (Comparative) was prepared by dissolving 12.50 grams of CAN in 36.50 grams of DI water and then 1.00 gram of ammonium trifluoroacetate (ATFA) was added. Solution C (representative of the present disclosure) was prepared by dissolving 12.5 grams of CAN in 27.50 grams of DI water. Next, 1.00 grams ATFA and 9 grams of a 1% aqueous solution of isopropanol (1800 ppm) were added.

Each of the above mentioned solutions were then placed in a controlled temperature water bath of 70° C. It took about 30 minutes for each of the solutions to reach 70° C.

Solution A precipitated after 35 minutes, Solution B was transparent for 3.5 hrs and then precipitated, while Solution C was transparent without any precipitation for more than 12 hrs.

EXAMPLE 2

In this example, three cerium-containing aqueous solutions were prepared and their bath lifetimes were determined. The first cerium-containing aqueous solution used in this example was Solution A, and the second cerium-containing aqueous solution used in this example was Solution B. Solutions A and B were prepared as described above in Example 1. Solution D (representative of the present disclosure) was prepared by first dissolving 12.5 gram of CAN in 27.50 grams of DI water. Next, 1.00 grams ATFA and 6 grams of a 1% aqueous solution of n-butanol (1200 ppm) were added.

Each of the above mentioned solutions (A, B and D) were then placed in a controlled temperature water bath of 70° C. It took about 30 minutes for each of the solutions to r reach 70° C.

Solution A precipitated after 35 minutes, Solution B was transparent for 3.5 hrs and then precipitated, while Solution D was transparent without any precipitation for more than 12 hrs.

EXAMPLE 3

In this example, three cerium-containing aqueous solutions were prepared and their bath lifetimes were determined. Solution A' (Comparative) was prepared by first dissolving 30 grams of cerium ammonium nitrate (CAN) in 70.00 grams of deionized (DI) water. Solution B' (Comparative) was prepared by dissolving 30.00 grams of CAN in 68 grams of DI water and then 2 grams of ammonium trifluoroacetate (ATFA) was added. Solution E (representative of the present disclosure) was prepared by first dissolving 28.5 grams of CAN in 68 grams of DI water. Next, 2 grams ATFA and 1.5 grams of cerium (III) nitrate were added.

Each of the above mentioned solutions (A', B' and E) were then placed in a controlled temperature water bath of 70° C. It took about 30 minutes for each of the solutions to reach 70° C.

Solution A' precipitated after 1.5 hours, Solution B' was transparent for 8 hrs and then precipitated, while Solution E was transparent without any precipitation for more than 16 hrs.

It is noted that cerium-containing aqueous solution of the present disclosure (i.e., Solutions C, D and E) had an extended bath lifetime as compared with the bath lifetimes for prior art cerium-containing aqueous solutions (i.e., Samples A, B, A' and B').

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of removing a mask material comprising:
   providing an ion implanted and patterned mask material atop a substrate; and
   contacting said ion implanted and patterned mask material with an aqueous solution comprising a cerium (IV) complex or salt and at least one booster additive, said at least one booster additive is a compound that can be oxidized by Ce (IV) and is present in said aqueous solution in an amount from 25 ppm to 2500 ppm, wherein said contacting removes said ion implanted and patterned mask material from atop said semiconductor substrate.

2. The method of claim 1, wherein said cerium (IV) complex or salt is at least one of ceric ammonium nitrate, ceric nitrate, ceric ammonium sulfate, ceric sulfate, ceric bisulfate, ceric perchlorate, ceric methanesulfonate, ceric trifluromethansulfonate, ceric chloride, ceric hydroxide and ceric actetate.

3. The method of claim 1, wherein said aqueous solution further comprising at least one ammonium salt as a stabilizer.

4. The method of claim 3, wherein said at least one ammonium salt comprises ammonium chloride, ammonium nitrate, ammonium sulfate $(NH_4)_2SO_4$, ammonium bisulfate, ammonium acetate, ammonium perchlorate $(NH_4ClO_4)$, ammonium trifluoroacetate, ammonium methanesulfonate, or ammonium trifluoromethane sulfonate.

5. The method of claim 1, wherein said aqueous solution further comprises at least one acid as a stabilizer.

6. The method of claim 5, wherein said at least one acid comprises nitric acid, hydrochloric acid, sulfuric acid, perchloric acid, glacial acetic acid, methanesulfonic acid, trifluoromethanesulfonic acid, polysulfonic acid, polyacrylic acid, polymethacrylic acid, polymaleic acid, polytetraflourosulfonic acid, poly(ethylene-maleic) acid or polystyrene carboxylic acid.

7. The method of claim 1, wherein said at least one booster additive is selected from monomeric and/or polymeric forms of an alcohol, a carboxylic acid, an aldehyde, a ketone, an ether, an ester, an amide, and compounds and mixtures thereof.

8. A method of removing a mask material comprising:
   providing an ion implanted and patterned mask material atop a substrate; and
   contacting said ion implanted and patterned mask material with an aqueous solution comprising a cerium (IV) complex or salt and at least one booster additive, said at least one booster additive is a compound that can be oxidized by Ce (IV) and is an alcohol selected from the group consisting of methanol, ethanol, propanol, isopropanol, n-butanol, isobutanol, t-butanol, ethylene glycol, glycerol, cyclopropanol, cyclobutanol, cyclopentanol, polyvinylalcohol (PVA), polyethylene glycol (PEG), and a polymer with at least one alcohol functionality as an end group, wherein said contacting removes said ion implanted and patterned mask material from atop said semiconductor substrate.

9. The method of claim 1, wherein said cerium-containing aqueous solution has a bath lifetime of greater than 12 hours at 70° C.

10. A method of removing a mask material comprising:
providing an ion implanted and patterned mask material atop a substrate; and
contacting said ion implanted and patterned mask material with an aqueous solution comprising a cerium (IV) complex, a stabilizer and at least one booster additive, said at least one stabilizer is ammonium trifluoroacetate and said at least one booster additive is a compound that can be oxidized by Ce (IV) and is a $C_1$-$C_5$ alcohol, wherein said contacting removes said ion implanted and patterned mask material from atop said semiconductor substrate.

11. A method of removing a mask material comprising:
providing an ion implanted and patterned mask material atop a substrate; and
contacting said ion implanted and patterned mask material with an aqueous solution comprising a cerium (IV) complex or salt, a cerium (III) complex or salt, and at least one booster additive, said at least one booster additive is a compound that can be oxidized by Ce (IV) and is present in said aqueous solution in an amount from 25 ppm to 2500 ppm, wherein said contacting removes said ion implanted and patterned mask material from atop said semiconductor substrate.

12. The method of claim 11, wherein said cerium (IV) complex or salt is at least one of ceric ammonium nitrate, ceric nitrate, ceric ammonium sulfate, ceric sulfate, ceric bisulfate, ceric perchlorate, ceric methanesulfonate, ceric trifluromethansulfonate, ceric chloride, ceric hydroxide and ceric actetate.

13. The method of claim 11, wherein said aqueous solution further comprising at least one ammonium salt as a stabilizer.

14. The method of claim 13, wherein said at least one ammonium salt comprises ammonium chloride, ammonium nitrate, ammonium sulfate $(NH_4)_2SO_4$, ammonium bisulfate, ammonium acetate, ammonium perchlorate $(NH_4ClO_4)$, ammonium trifluoroacetate, ammonium methanesulfonate, or ammonium trifluoromethane sulfonate.

15. The method of claim 11, wherein said aqueous solution further comprises at least one acid as a stabilizer.

16. The method of claim 15, wherein said at least one acid comprises nitric acid, hydrochloric acid, sulfuric acid, perchloric acid, glacial acetic acid, methanesulfonic acid, trifluoromethanesulfonic acid, polysulfonic acid, polyacrylic acid, polymethacrylic acid, polymaleic acid, polytetraflourosulfonic acid, poly(ethylene-maleic) acid or polystyrene carboxylic acid.

17. The method of claim 11, wherein said at least one cerium (III) complex or salt is formed by adding a cerium (III) compound to said aqueous solution.

18. The method of claim 11, wherein said at least one cerium (III) complex or salt is formed in-situ by reducing a portion of the cerium (IV) complex or salt with a reducing agent.

19. The method of claim 1, wherein said at least one booster additive is selected from monomeric and/or polymeric forms of an alcohol, an aldehyde, a ketone, an ether, an ester, an amide, and compounds and mixtures thereof.

20. The method of claim 1, wherein said at least one booster additive is present in amount from 50 ppm to 500 ppm.

21. The method of claim 11, wherein said at least one booster additive is selected from monomeric and/or polymeric forms of an alcohol, a carboxylic acid, an aldehyde, a ketone, an ether, an ester, an amide, and compounds and mixtures thereof.

22. The method of claim 11, wherein said at least one booster additive is selected from monomeric and/or polymeric forms of an alcohol, an aldehyde, a ketone, an ether, an ester, an amide, and compounds and mixtures thereof.

23. The method of claim 1, wherein said at least one booster additive is present in amount from 50 ppm to 500 ppm.

* * * * *